(12) United States Patent
Chen et al.

(10) Patent No.: US 8,866,192 B1
(45) Date of Patent: Oct. 21, 2014

(54) SEMICONDUCTOR DEVICE, HIGH ELECTRON MOBILITY TRANSISTOR (HEMT) AND METHOD OF MANUFACTURING

(71) Applicant: Taiwan Semiconductor Manufacturing Company, LTD., Hsinchu (TW)

(72) Inventors: Chi-Ming Chen, Zhubei (TW); Po-Chun Liu, Hsinchu (TW); Chung-Yi Yu, Hsinchu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 0 days.

(21) Appl. No.: 13/944,625

(22) Filed: Jul. 17, 2013

(51) Int. Cl.
*H01L 29/778* (2006.01)
*H01L 29/66* (2006.01)

(52) U.S. Cl.
CPC ........ *H01L 29/778* (2013.01); *H01L 29/66431* (2013.01)
USPC .......................................... 257/194; 438/172

(58) Field of Classification Search
USPC ....................................................... 257/194
See application file for complete search history.

(56) References Cited

U.S. PATENT DOCUMENTS

| 7,112,830 | B2 | 9/2006 | Munns |
| 7,547,925 | B2 | 6/2009 | Wong et al. |
| 2007/0108456 | A1 | 5/2007 | Wong et al. |

OTHER PUBLICATIONS

Srivastava, P., et al., "Si Trench Around Drain (STAD) Technology of GaN-DHFETs on Si Substrate for Boosting Power Performance", IEEE, 2001.

*Primary Examiner* — Zandra Smith
*Assistant Examiner* — Lawrence Tynes, Jr.
(74) *Attorney, Agent, or Firm* — Lowe Hauptman & Ham, LLP (57) ABSTRACT

A semiconductor device includes a substrate, a channel layer formed over the substrate, an active layer formed over the channel layer, and a gate structure formed over the active layer. The active layer is configured to cause a two dimensional electron gas (2DEG) to be formed in the channel layer along an interface between the channel layer and the active layer. The gate structure is configured to deplete the 2DEG under the gate structure. The active layer has a negatively charged region under the gate structure. The negatively charged region is configured to further deplete the 2DEG under the gate structure.

20 Claims, 8 Drawing Sheets

SEMICONDUCTOR DEVICE, HIGH ELECTRON MOBILITY TRANSISTOR (HEMT) AND METHOD OF MANUFACTURING

RELATED APPLICATIONS

The instant application is related to the following U.S. patent applications:

U.S. Patent Application titled "TRANSISTOR HAVING PARTIALLY OR WHOLLY REPLACED SUBSTRATE AND METHOD OF MAKING THE SAME," Ser. No. 13/944,779;

U.S. Patent Application titled "TRANSISTOR HAVING HIGH BREAKDOWN VOLTAGE AND METHOD OF MAKING THE SAME," Ser. No. 13/944,713;

U.S. Patent Application titled "TRANSISTOR HAVING BACK-BARRIER LAYER AND METHOD OF MAKING THE SAME," Ser. No. 13/944,584;

U.S. Patent Application titled "TRANSISTOR HAVING DOPED SUBSTRATE AND METHOD OF MAKING THE SAME," Ser. No. 13/944,494;

U.S. Patent Application titled "TRANSISTOR HAVING A BACK-BARRIER LAYER AND METHOD OF MAKING THE SAME," Ser. No. 944,672; and U.S. Patent Application titled "TRANSISTOR HAVING OHMIC CONTACT BY GRADIENT LAYER AND METHOD OF MAKING SAME" Ser. No. 14/010,268; and U.S. Patent Application titled "TRANSISTOR HAVING AN OHMIC CONTACT BY SCREEN LAYER AND METHOD OF MAKING THE SAME" Ser. No. 14/010,220.

U.S. Patent Application titled "TRANSISTOR HAVING METAL DIFFUSION BARRIER AND METHOD OF MAKING THE SAME" Ser. No. 13/948,925.

The entire contents of the above-referenced applications are incorporated by reference herein.

BACKGROUND

Due to high current density, high breakdown voltage, and low ON resistance, High Electron Mobility Transistors (HEMTs) are suitable for use in power applications. A HEMT structure includes a channel layer and an active layer. A two-dimensional electron gas (2DEG) is generated in the channel layer, adjacent an interface with the active layer. The 2DEG is used in the HEMT structure as charge carriers. The 2DEG is generated even in the absence of a voltage applied to the HEMT structure. Thus, a HEMT structure is, by nature, a normally ON structure with a negative threshold voltage. A consideration in designing circuitry for power applications involves converting a normally ON HEMT structure to a normally OFF HEMT structure with a positive threshold voltage.

BRIEF DESCRIPTION OF THE DRAWINGS

One or more embodiments are illustrated by way of example, and not by limitation, in the figures of the accompanying drawings, wherein elements having the same reference numeral designations represent like elements throughout. The drawings are not to scale, unless otherwise disclosed.

DETAILED DESCRIPTION

It is to be understood that the following disclosure provides many different embodiments or examples, for implementing different features of various embodiments. Specific examples of components and arrangements are described below to simplify the present disclosure. An inventive concept may; however, be embodied in many different forms and should not be construed as being limited to the embodiments set forth herein. It will be apparent; however, that one or more embodiments may be practiced without these specific details. Like reference numerals in the drawings denote like elements.

In some embodiments, in order to convert a normally ON HEMT structure to a normally OFF HEMT structure, a gate structure formed over the active layer is configured to deplete the 2DEG under the gate structure. To further deplete the 2DEG, a negatively charged region is formed in the active layer, under the gate structure. As a result, the HEMT structure in accordance with some embodiments achieves an increase in the threshold voltage, without decreasing the carrier density in the 2DEG and/or increasing the channel resistance (RS). The described technique is suitable not only for HEMT structures, but also for other types of semiconductor devices which use 2DEGs as charge carriers.

Figure 1A:
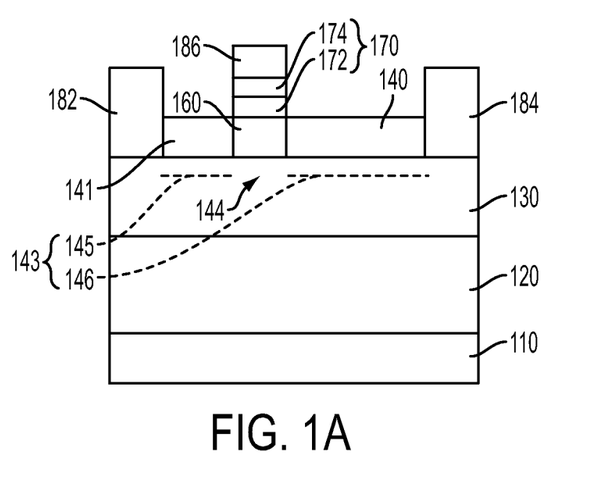
FIG. 1A is a schematic cross-sectional view of a semiconductor device in accordance with some embodiments.

FIG. 1A is a schematic cross-sectional view of a semiconductor device 100 in accordance with some embodiments. The semiconductor device 100 comprises a substrate 110, a buffer layer 120 over the substrate 110, a channel layer 130 over the buffer layer 120, and an active layer 140 over the channel layer 130 and having a negatively charged region 160. The semiconductor device 100 further comprises a gate structure 170 over the negatively charged region 160 and having a p-doped layer 172 and an n-doped layer 174. The semiconductor device 100 also comprises a source electrode 182 and a drain electrode 184 over the channel layer 130, and a gate electrode 186 over the gate structure 170.

In some embodiments, the substrate 110 includes a silicon carbide (SiC) substrate, sapphire substrate, or a silicon substrate. In at least one embodiment, the substrate 110 includes a Si(111) wafer to provide an optimal lattice mismatch with an overlying layer, such as a GaN layer described herein.

In some embodiments, the buffer layer 120 includes a nucleation layer over the substrate 110. The nucleation layer has a lattice structure and/or a thermal expansion coefficient (TEC) suitable for bridging the lattice mismatch and/or the TEC mismatch between the substrate 110 and an overlying layer, such as the channel layer 130. In some embodiments, the nucleation layer includes aluminum nitride (AlN). In some embodiments, the nucleation layer has a thickness of 70 to 300 nanometers (nm). In some embodiments, the nucleation layer is omitted.

In some embodiments, the buffer layer 120 includes a transition layer over the nucleation layer, or over the substrate 110 in one or more embodiments where the nucleation layer is omitted. The transition layer further facilitates gradual changes of lattice structures and TECs between the nucleation layer (or the substrate 110) and the channel layer 130. In some embodiments, the transition layer includes a graded aluminum-gallium nitride ($Al_xGa_{(1-x)}N$, x is the aluminum content ratio in the aluminum-gallium constituent) layer. In some embodiments, the graded aluminum gallium nitride layer includes multiple layers each having a decreased ratio x (from a bottom layer adjoining the nucleation layer to a top layer adjoining the channel layer 130. In at least one embodiment, the graded aluminum gallium nitride layer has three layers having the x ratio in the range of 0.7-0.9 for the bottom layer, in the range of 0.4-0.6 for a middle layer, and in the range of 0.15-0.3 for the top layer. In some embodiments, instead of having multiple layers with different x ratios, the graded aluminum gallium nitride layer has a continuous gradient of the ratio x. In some embodiments, the transition layer has a thickness of 500 to 1050 nm. In some embodiments, the transition layer is omitted.

In some embodiments, the channel layer 130 includes one or more III-V compound layers. One or more of the III-V compound layers is doped in at least one embodiment. In one or more embodiments, the channel layer 130 includes alternatingly arranged p-doped and n-doped III-V compound layers. In at least one embodiment, the channel layer 130 includes a C-doped GaN layer. In some embodiments, the channel layer 130 has a thickness of 500 to 5000 nm.

The active layer 140 includes one or more III-V compound layers which are different from the III-V compound layers of the channel layer 130 in composition. In some embodiments, the active layer 140 comprises AlN, $Al_yGa_{(1-y)}N$ (where y is the aluminum content ratio), or a combination thereof. The active layer 140 is configured to cause a 2DEG to be formed in the channel layer 130 along an interface 141 between the channel layer 130 and the active layer 140. A heterojunction is formed between the active layer 140 and the channel layer 130 having two different semiconductor materials. A band gap discontinuity exists between the active layer 140 and the channel layer 130. The electrons from a piezoelectric effect in the active layer 140 drop into the channel layer 130, and thus create a thin layer 143 of highly mobile conducting electrons, i.e., the 2DEG, in the channel layer 130, adjacent the interface 141 with the active layer 140. The electrons in the 2DEG are charge carriers in the channel layer 130. When a voltage is applied to the gate electrode 186, it is possible to modulate a current (i.e., a drain current) flowing through the channel layer 130, from the drain electrode 184 to the source electrode 182.

Figure 1B:
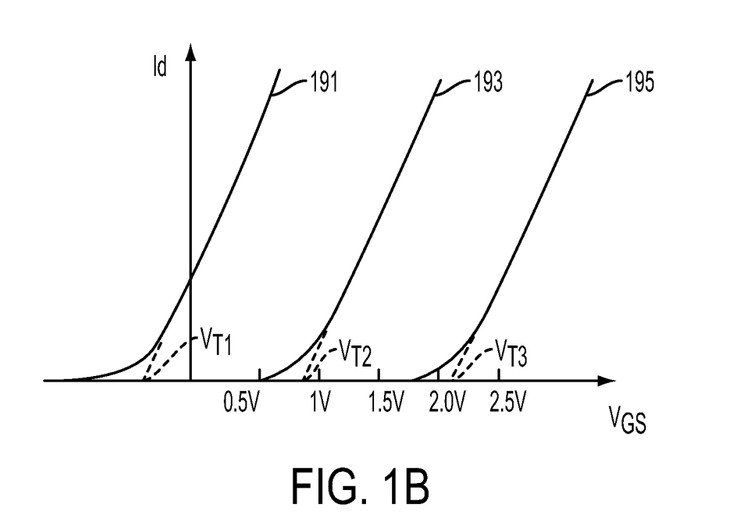
FIG. 1B is a graph showing various relationships between the gate-source voltage and the drain current in various semiconductor devices.

The 2DEG is generated naturally at the interface 141 of different III-V compound materials forming the heterojunction between the channel layer 130 and the active layer 140. Due to the naturally occurring 2DEG and without the negatively charged region 160 and/or the gate structure 170, the semiconductor device 100 would be conductive without the application of a voltage to the gate electrode 186, i.e., the semiconductor device 100 would be a normally ON device. A gate-source voltage versus drain current relationship 191 of a normally ON HEMT structure, which has a negative threshold voltage $V_{T1}$, is shown in FIG. 1B. Such a normally ON state is a design concern in power applications where it is desirable to prevent current from flowing in or through the HEMT structure before the circuitry is powered, for example, to reduce power consumption and/or avoid start-up issues.

In some embodiments, to convert a normally ON HEMT structure to a normally OFF HEMT structure, a gate structure formed over the active layer is configured to deplete the 2DEG under the gate structure. For example, the gate structure 170 formed over the active layer 140 is configured to deplete the 2DEG under the gate structure 170, i.e., the 2DEG is depleted in an area 144 under the gate structure 170, leaving the 2DEG in areas 145, 146, between (i) the gate structure 170 and (ii) the source electrode 182 and the drain electrode 184, respectively. The gate structure 170 includes the p-doped layer 172 over the active layer 140, and the n-doped layer 174 over the p-doped layer 172. Example materials for the p-doped layer 172 and/or the n-doped layer 174 include, but are not limited to, GaN, AlGaN, InGaN and InAlGaN. Examples of p-type dopants include, but are not limited to, carbon, iron, magnesium, and zinc. Examples of n-type dopants include, but are not limited to, silicon and oxygen. In at least one embodiment, the n-doped layer 174 is omitted.

The p-doped layer 172, e.g., p-doped GaN or p-GaN, and the active layer 140, e.g., $Al_yGa_{(1-y)}N$, together form a PN junction over the area 144. Such a PN junction depletes the 2DEG in the area 144 under the gate structure 170, when no voltage is applied to the semiconductor device 100. In at least one embodiment where the n-doped layer 174 is provided, the n-doped layer 174, e.g., n-doped GaN or n-GaN, defines together with the p-doped layer 172 and the active layer 140, an NPN junction which also depletes the 2DEG in the area 144 under the gate structure 170. The n-doped layer 174 is further configured as a contact layer between the p-doped layer 172 and the gate electrode 186. Because the PN or NPN junction depletes the 2DEG in the area 144 under the gate structure 170, the 2DEG is interrupted in the area 144 and current is no longer flowing in the semiconductor device 100 when no voltage is applied to the semiconductor device 100. The semiconductor device 100 with the gate structure 170 is a normally OFF HEMT structure, which has a gate-source voltage versus drain current relationship 193 with a positive threshold voltage $V_{T2}$, as shown in FIG. 1B.

Although the semiconductor device 100 with the gate structure 170 is a normally OFF HEMT structure suitable for power applications, in some situations, the positive threshold voltage $V_{T2}$ provided by the gate structure 170 is insufficient. In some embodiments, to further increase the threshold voltage of the semiconductor device 100, the negatively charged region 160 is provided in the active layer 140, under the gate structure 170. In at least one embodiment, the negatively charged region 160 includes negative ions implanted into a gate area of the active layer 140 under the gate structure 170, i.e., over the area 144. Examples of negative ions in the negatively charged region 160 include, but are not limited to, ions of one or more of F, Mg, Fe, C and Zn. The negative ions electrostatically repel electrons in the 2DEG further away from the area 144 under the negatively charged region 160. In other words, the negatively charged region 160 further deplete the 2DEG under the gate structure 170. The semiconductor device 100 with both the gate structure 170 and the negatively charged region 160 has a gate-source voltage versus drain current relationship 195 shown in FIG. 1B. The threshold voltage $V_{T3}$ of the semiconductor device 100 with both the gate structure 170 and the negatively charged region 160 is higher than the threshold voltage $V_{T2}$ of the semiconductor device 100 if the negatively charged region 160 is not provided. The higher threshold voltage $V_{T3}$ renders the semiconductor device 100 suitable for use in various applications, especially power applications, in accordance with some embodiments. The threshold voltage achievable in HEMTs in accordance with some embodiments is at least 1.5 V.

Compared to other approaches, the higher threshold voltage $V_{T3}$ is achieved in the semiconductor device 100 in accordance with some embodiments, without decreasing the carrier density in the 2DEG and/or increasing the channel resistance. For example, to increase the threshold voltage of a HEMT structure, the other approaches propose reducing the thickness and/or the aluminum content ratio of AlGaN in the active layer. However, a reduction in thickness or aluminum content ratio of AlGaN in the active layer also reduces the electron density of the 2DEG which, in turn, results in an increased channel resistance and/or a lower current flowing through the HEMT structure. Such an increased channel resistance and/or reduced current are design concerns in various power applications. By increasing the threshold voltage without decreasing the carrier density in the 2DEG and/or increasing the channel resistance, the semiconductor device 100 in accordance with some embodiments is advantageous over HEMT structures of the other approaches described herein.

Figure 2:
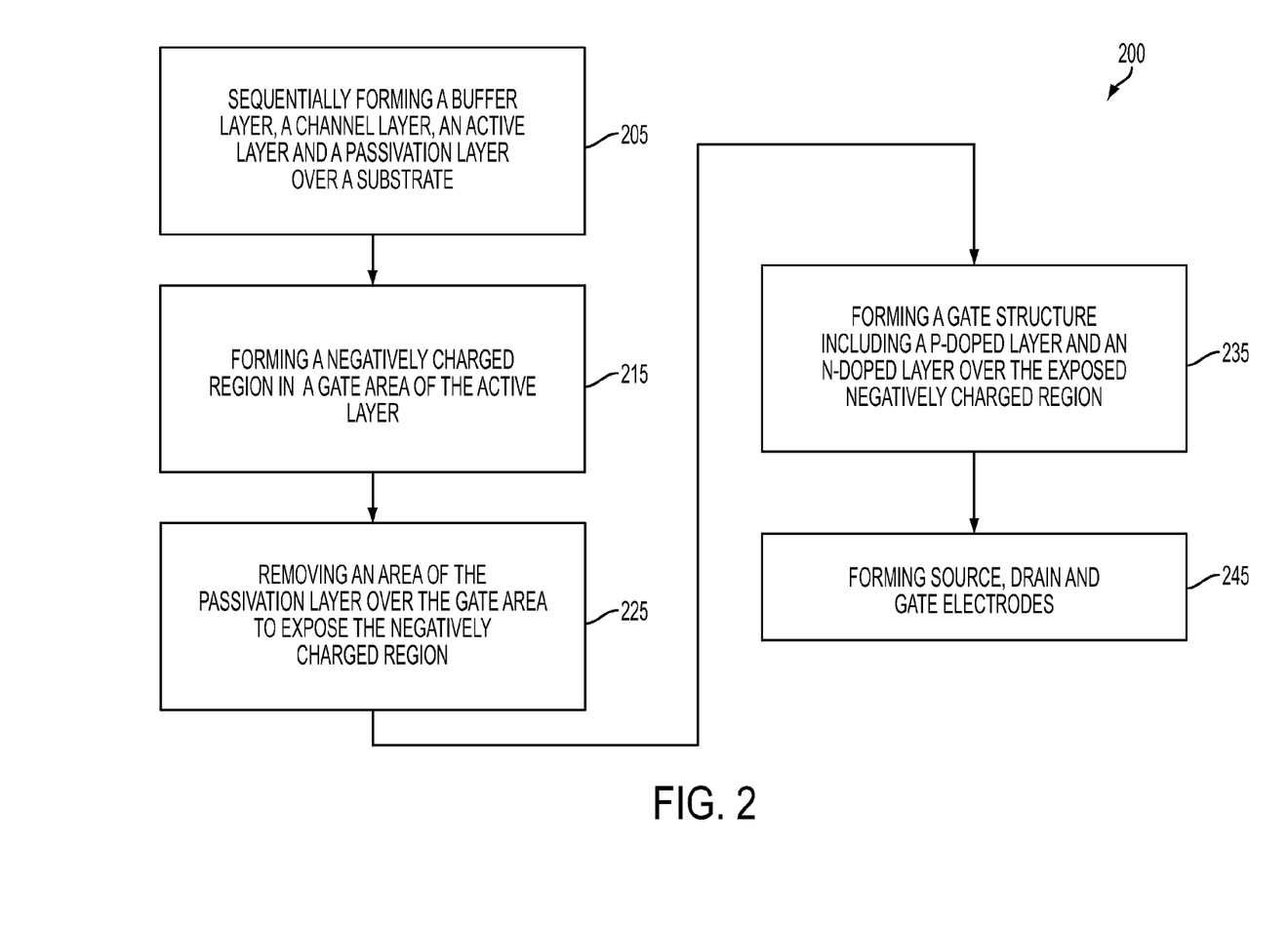
FIG. 2 is a flow chart of a method of manufacturing a semiconductor device in accordance with some embodiments.

FIG. 2 is a flow chart of a method 200 of manufacturing a semiconductor device in accordance with some embodiments, and FIGS. 3A-3E are schematic cross-sectional views of the semiconductor device at various stages during manufacture in accordance with some embodiments.

Figure 3A:
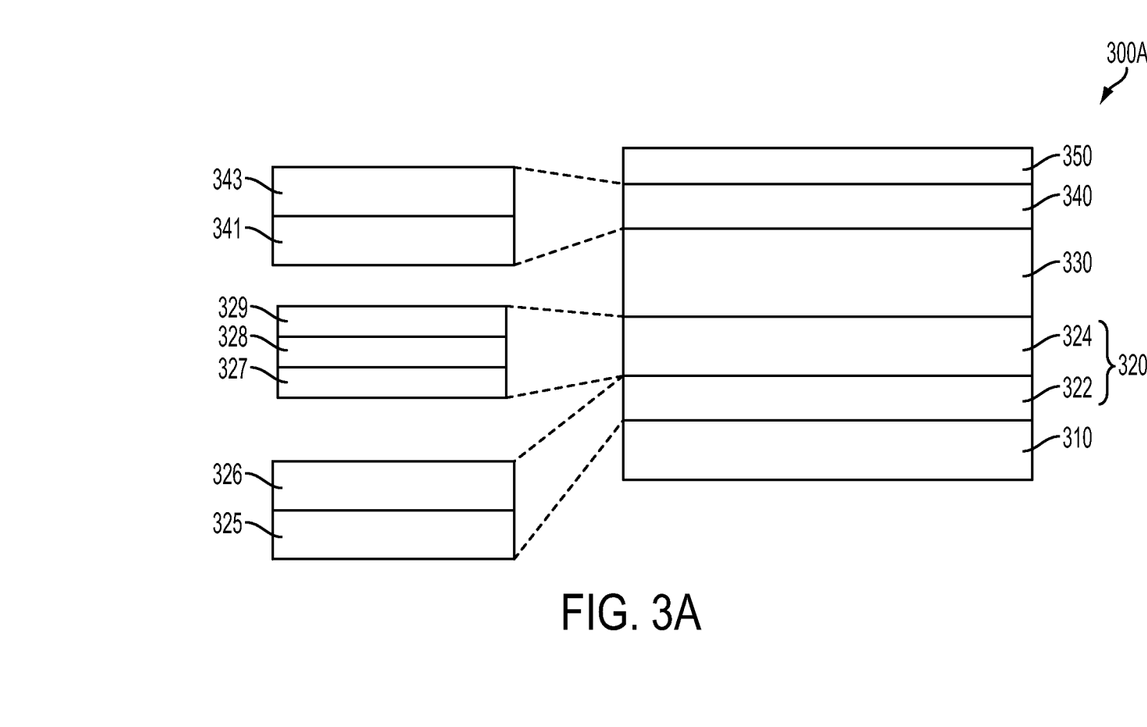
FIGS. 3A-3E are schematic cross-sectional views of a semiconductor device at various stages during manufacture in accordance with some embodiments.

At operation 205 in FIG. 2, a buffer layer, a channel layer, an active layer and a passivation layer are sequentially formed over a substrate. For example, as shown in FIG. 3A, a substrate 310 is provided, and a buffer layer 320, a channel layer 330, an active layer 340 and a passivation layer 350 are sequentially formed over the substrate 310, resulting in a structure 300A. In some embodiments, the substrate 310, the buffer layer 320, the channel layer 330 and the active layer 340 correspond to the substrate 110, the buffer layer 120, the channel layer 130 and the active layer 140 described with respect to FIG. 1A.

As shown in FIG. 3A, the buffer layer 320 includes a nucleation layer 322 formed over the substrate 310. In at least one embodiment, the substrate 310 includes an Si(111) substrate. In some embodiments, the nucleation layer 322 comprises AlN. In some embodiments, the nucleation layer 322 is formed by a metal-organic chemical vapor deposition (MOCVD) process, using aluminum-containing precursor and nitrogen-containing precursor. In some embodiments, the aluminum-containing precursor includes trimethylaluminium (TMA), triethylaluminium (TEA), or other suitable chemical. In some embodiments, the nitrogen-containing precursor includes ammonia, tertiarybutylamine (TBAm), phenyl hydrazine, or other suitable chemical. In some embodiments, the nucleation layer 322 includes a lower AlN layer 325 and an upper AlN layer 326. In at least one embodiment, the lower AlN layer 325 is formed at a lower temperature than the upper AlN layer 326, and the lower AlN layer 325 is referred to as a low temperature (LT) AlN layer whereas the upper AlN layer 326 is referred to as a high temperature (HT) AlN layer. For example, the lower AlN layer 325 is formed, e.g., grown, at a temperature of 900 to 1000° C. to a thickness of 20 to 80 nm, and the upper AlN layer 326 is formed, e.g., grown, at a higher temperature of 1000 to 1300° C. to a thickness of 50 to 200 nm. In some embodiments, the nucleation layer 322 comprises a material other than AlN. In some embodiments, the nucleation layer 322 and the operation for forming the nucleation layer 322 are omitted.

The buffer layer 320 includes a transition layer 324 formed over the nucleation layer 322, or over the substrate 310 in at least one embodiment where the nucleation layer 322 is not formed. In some embodiments, the transition layer 324 is a graded aluminum-gallium nitride AlxGa(1-x)N layer. In some embodiments, the graded aluminum gallium nitride layer has two or more of aluminum-gallium nitride layers each having a different ratio x decreased from the bottom to the top. In some embodiments, each of the two or more of aluminum-gallium nitride layers is formed by a MOCVD process, using aluminum-containing precursor, gallium-containing precursor, and nitrogen-containing precursor. In some embodiments, the aluminum-containing precursor includes TMA, TEA, or other suitable chemical. In some embodiments, the gallium-containing precursor includes trimethylgallium (TMG), triethylgallium (TEG), or other suitable chemical. In some embodiments, the nitrogen-containing precursor includes ammonia, TBAm, phenyl hydrazine, or other suitable chemical. In at least one embodiment, the transition layer 324 includes a bottom AlGaN layer 327, a middle AlGaN layer 328 and a top AlGaN layer 329. The bottom AlGaN layer 327 has the aluminum content ratio x of 0.7 to 0.9 and is formed, e.g., grown, at a temperature of 1000 to 1200° C. to a thickness of 50 to 200 nm. The middle AlGaN layer 328 has the aluminum content ratio x of 0.4 to 0.6 and is formed, e.g., grown, at a temperature of 1000 to 1200° C. to a thickness of 150 to 250 nm. The top AlGaN layer 329 has the aluminum content ratio x of 0.15 to 0.3 and is formed, e.g., grown, at a temperature of 1000 to 1200° C. to a thickness of 350 to 650 nm. Other numbers of AlGaN layers and/or aluminum content ratios in individual AlGaN layers are within the scope of various embodiments. In some embodiments, the graded aluminum gallium nitride layer has a continuous gradient of the ratio x gradually decreased from the bottom to the top and is formed by a MOCVD process. In some embodiments, the transition layer 324 and the operation for forming the transition layer 324 are omitted.

The channel layer 330 includes one or more III-V compound layers formed over substrate 310, the nucleation layer 322, and/or the transition layer 324. One or more of the III-V compound layers is doped in at least one embodiment. For example, the channel layer 330 in at least one embodiment includes C-doped GaN. In some embodiments, the channel layer 330 is formed, e.g., grown, by a MOCVD process using gallium-containing precursor and nitrogen-containing precursor, at a temperature of 1000 to 1200° C. to a thickness of 500-5000 nm.

The active layer 340 is formed over the channel layer 330. In some embodiments, the active layer 340 includes AlGaN, aluminum-gallium Arsenide (AlGaAs), aluminum-Indium phosphide (AlInP), or a combination thereof. In some embodiments, the active layer 340 is formed by a MOCVD process, using aluminum-containing precursor, gallium-containing precursor, and nitrogen-containing precursor. In at least one embodiment, the active layer 340 includes a lower AlN layer 341 and an upper $Al_yGa_{(1-y)}N$ layer 342. The lower AlN layer 341 is formed, e.g., grown, at a temperature of 1000 to 1200° C. to a thickness of 0.5 to 1.5 nm. The upper $Al_yGa_{(1-y)}N$ layer 342 has the aluminum content ratio of 0.1 to 0.3 and is formed, e.g., grown, at a temperature of 1000 to 1200° C. to a thickness of 10 to 40 nm.

The passivation layer 350 is formed over the active layer 340. Examples of materials for the passivation layer 350 include, but are not limited to, silicon nitride, silicon oxide, and silicon oxynitride. In at least one embodiment, the passivation layer 350 is SiN formed by chemical vapor deposition (CVD) to a thickness of 100 nm.

Figure 3B:
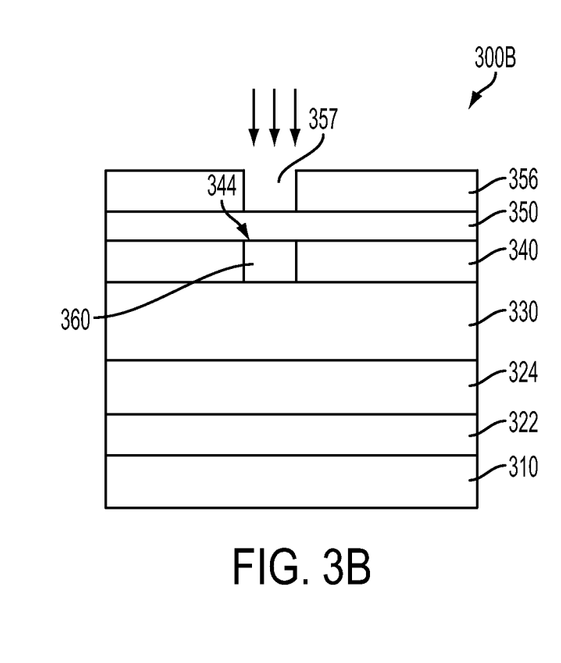

At operation 215 in FIG. 2, a negatively charged region is formed in a gate area of the active layer. For example, as shown in FIG. 3B, a negatively charged region 360 is formed in a gate area 344 of the active layer active layer 340, resulting in a structure 300B. In some embodiments, the negatively charged region 360 corresponds to the negatively charged region 160 described with respect to FIG. 1A.

As shown in FIG. 3B, a photoresist layer 356 is formed over the passivation layer 350, and patterned, e.g., by a lithography process, to define an opening 357 over the gate area 344 of the active layer 340. In some embodiments, the negatively charged region 360 is formed by an ion implantation process for implanting negative ions, through the passivation layer 350, into the gate area 344 of the active layer 340 to form the negatively charged region 360 therein. By performing the ion implantation through the passivation layer 350, it is possible, in some embodiments, to control the implantation depth and/or doping profile. Examples of ion implantation processes include, but are not limited to, ionized metal plasma (IMP), plasma-enhanced chemical vapor deposition (PECVD), and reactive ion etch (RIE). Examples of negative ions include, but are not limited to, ions of one or more of F, Mg, Fe, C and Zn. In at least one embodiment, a concentration of the negative ions in the gate area 344 of the active layer 340 is from 1E18 $cm^{-3}$ to 1E23 $cm^{-3}$. In one example embodiment, the negatively charged region 360 is formed by IMP with F ions at plasma power of 30 to 50 KeV and at a dose of 1E15 $cm^{-2}$.

At operation 225 in FIG. 2, an area of the passivation layer over the gate area is removed to expose the negatively charged region. For example, as shown in FIG. 3C, an area of the passivation layer 350 over the negatively charged region 360 in the gate area 344 is removed to form an opening 359 that exposes the negatively charged region 360, resulting in a structure 300C.

Figure 3C:
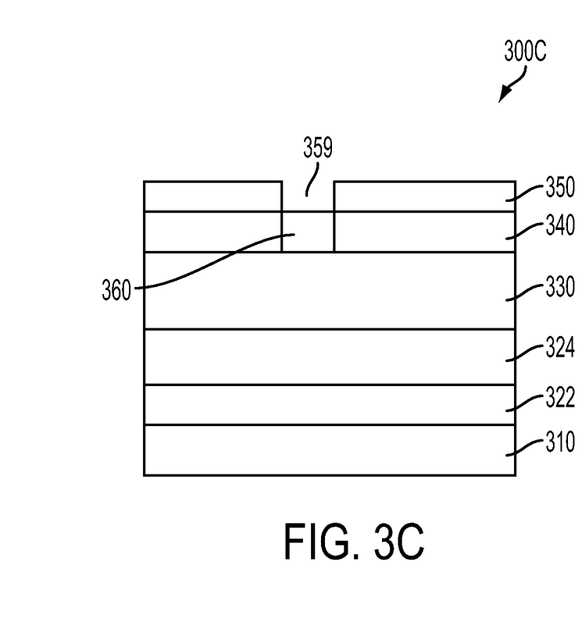

As shown in FIG. 3C, the photoresist layer 356 is removed after the ion implantation described with respect to FIG. 3B. For example, the photoresist layer 356 is removed by an ashing process. In at least one embodiment, a post-implantation anneal is performed to drive the implanted negative ions further into the active layer 340 and closer to the interface with the channel layer 330. For example, the post-implantation anneal is performed at a temperature of 1000 to 1100° C. for 60 seconds. The removal of the photoresist layer 356 exposes the underlying passivation layer 350. The exposed passivation layer 350 is then etched to form an opening 359 that exposes the negatively charged region 360. For example, the passivation layer 350 is etched by a plasma etching process.

Figure 3D:
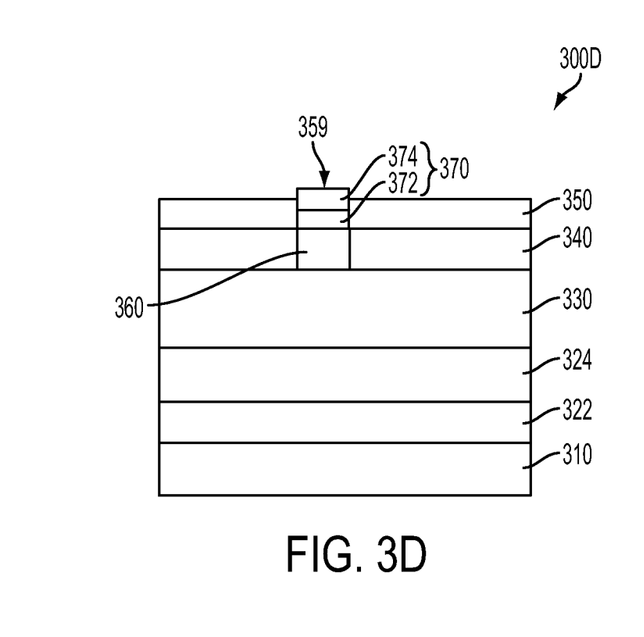

At operation 235 in FIG. 2, a gate structure including a p-doped layer and an n-doped layer is formed over the exposed negatively charged region. For example, as shown in FIG. 3D, a gate structure 370 including a p-doped layer 372 and an n-doped layer 374 is formed over the exposed negatively charged region 360, resulting in a structure 300D. In some embodiments, the gate structure 370, the p-doped layer 372 and the n-doped layer 374 correspond to the gate structure 170, the p-doped layer 172 and the n-doped layer 174 described with respect to FIG. 1A.

As shown in FIG. 3D, the p-doped layer 372 is formed in the opening 359 of the passivation layer 350, over the negatively charged region 360 exposed by the opening 359. In at least one embodiment, the p-doped layer 372 includes a p-GaN layer. For example, the p-GaN layer includes Mg-doped GaN having the Mg concentration of about 1E19 $cm^{-3}$. The Mg-doped GaN layer is formed, e.g., grown, by an MOCVD process, to a thickness of about 75 nm. The n-doped layer 374 is formed over the n-doped layer 372 in the opening 359 of the passivation 350. In at least one embodiment, the n-doped layer 374 includes an n-GaN layer. For example, the n-GaN layer includes Si-doped GaN having the Si concentration of about 1E18 $cm^{-3}$. The Si-doped GaN layer is formed, e.g., grown, by an MOCVD process, to a thickness of about 50 nm. In some embodiments, the n-doped layer 374 and the operation for forming the n-doped layer 374 are omitted.

Figure 3E:
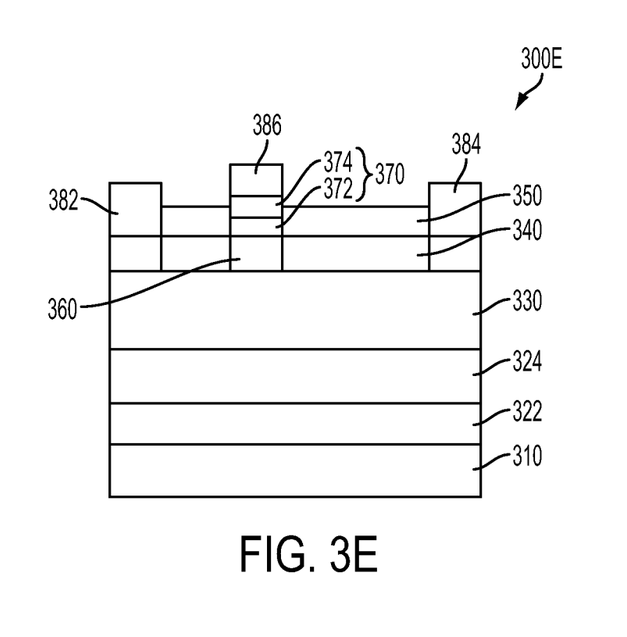

At operation 245 in FIG. 2, a source electrode, a drain electrode and a gate electrode are formed. For example, as shown in FIG. 3E, a source electrode 382, a drain electrode 384 and a gate electrode 386 are formed, resulting in semiconductor device 300E. In some embodiments, the source electrode 382, the drain electrode 384 and the gate electrode 386 correspond to the source electrode 182, the drain electrode 184 and the gate electrode 186 described with respect to FIG. 1A.

As shown in FIG. 3E, the source electrode 382 and the drain electrode 384 are formed over the channel layer 330, whereas the gate electrode 386 is formed over the gate structure 370. In some embodiments, a patterned mask layer (i.e., a photoresist layer) is formed over the structure 300D obtained by the operations described with respect to FIG. 3D. An etching process is performed to remove portions of the passivation layer 350 and the active layer 340 to form openings partially exposing the underlying channel layer 330 in source and drain regions corresponding to the source electrode 382 and drain electrode 384 to be formed. A metal layer is then deposited over the resulting structure, fills the openings and contacts the channel layer 330. Another patterned photoresist layer is formed over the metal layer, and the metal layer outside the openings are etched to form the source electrode 382 and drain electrode 384 over the filled openings. In some embodiments, the source electrode 382 and/or the drain electrode 384 include one or more layers of conductive materials, such as a Ti/Al/Ti stack. In at least one embodiment, an annealing process is performed to form ohmic contacts at the source electrode 382 and the drain electrode 384. For example, the annealing process is performed at 850° C. for 60 seconds. The gate electrode 386 is formed in a similar manner over the gate structure 370. One or more processes for forming the gate electrode 386 is performed together with one or more processes for forming the source electrode 382 and the drain electrode 384. In at least one embodiment, a gate dielectric layer is formed between the gate structure 370 and the gate electrode 386. Examples of materials for the gate dielectric layer include, but are not limited to, silicon oxide ($SiO_2$), silicon nitride ($Si_3N_4$), aluminum oxide ($Al_2O_3$), tantalum oxide ($Ta_2O_5$), titanium oxide ($TiO_2$), zinc oxide ($ZnO_2$), hafnium oxide ($HfO_2$), and a combination thereof.

Figure 4:
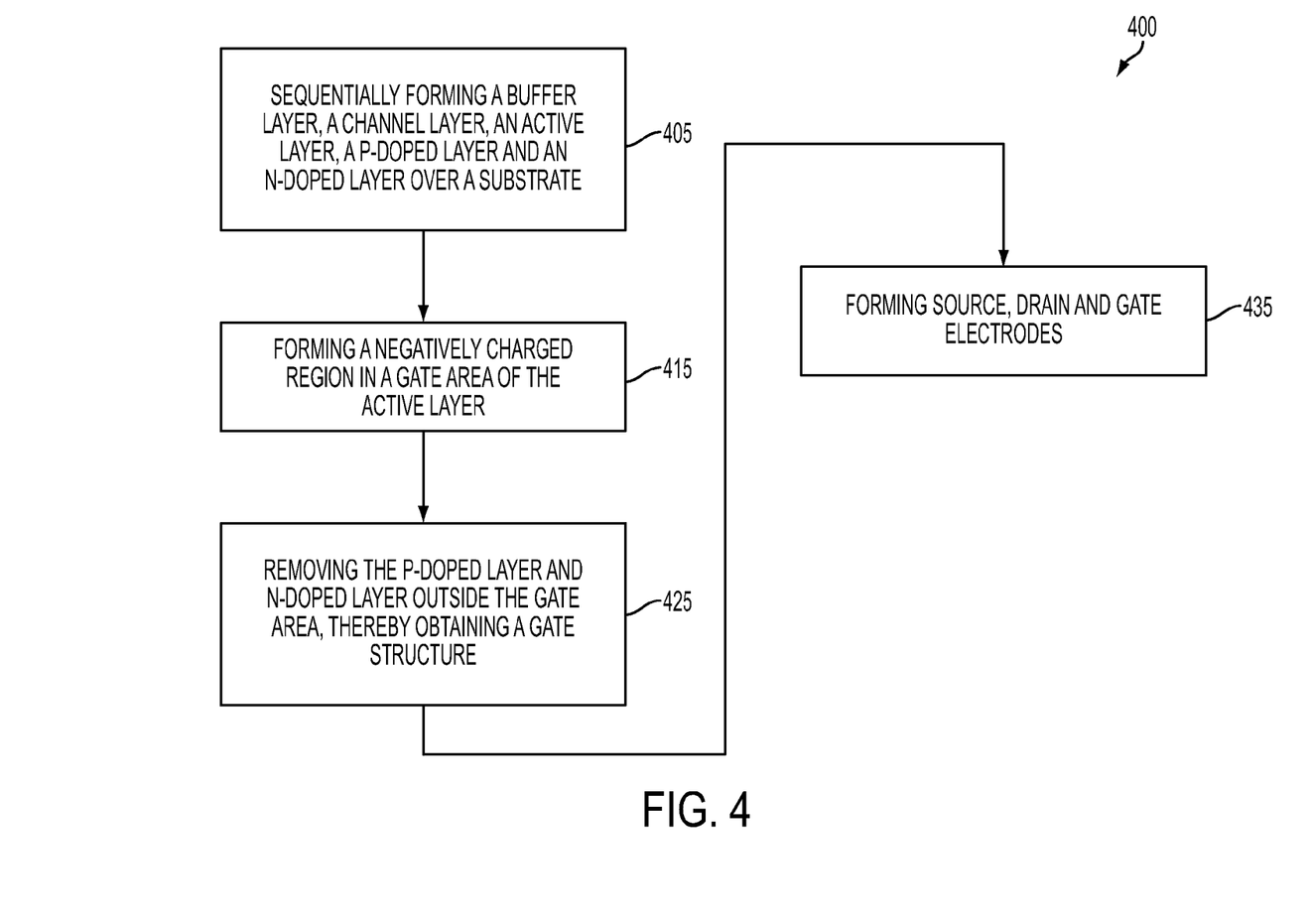
FIG. 4 is a flow chart of a method of manufacturing a semiconductor device in accordance with some embodiments.

In the method described with respect to FIG. 2, a negatively charged region is formed in the active layer before the formation of a p-doped layer of a gate structure. However, it is possible to form a negatively charged region in the active layer after the formation of a p-doped layer of a gate structure, as described with respect to FIGS. 4 and 5A-5D. FIG. 4 is a flow chart of a method 400 of manufacturing a semiconductor device in accordance with some embodiments, and FIGS. 5A-5D are schematic cross-sectional views of the semiconductor device at various stages during manufacture in accordance with some embodiments.

Figure 5A:
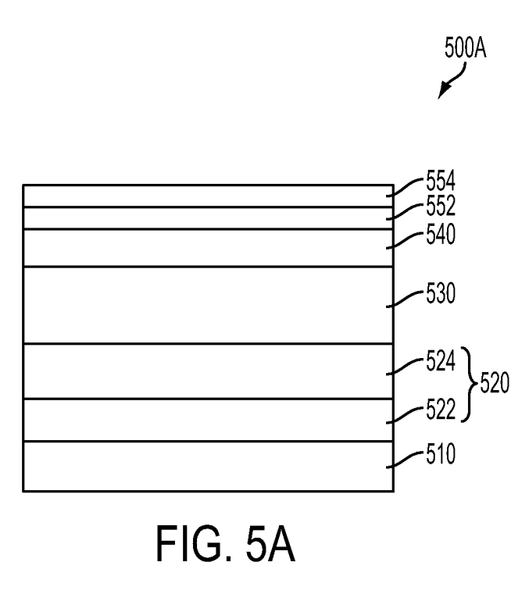
FIGS. 5A-5D are schematic cross-sectional views of a semiconductor device at various stages during manufacture in accordance with some embodiments.

At operation 405 in FIG. 4, a buffer layer, a channel layer, an active layer, a p-doped layer and an n-doped layer are sequentially formed over a substrate. For example, as shown in FIG. 5A, a substrate 510 is provided, a buffer layer 520 including a nucleation layer 522 and a transition layer 524, a channel layer 530, an active layer 540, a p-doped layer 552 and an n-doped layer 554 are sequentially formed over the substrate 310, resulting in a structure 500A. In some embodiments, the substrate 510, the buffer layer 520, the channel layer 530, the active layer 540, the p-doped layer 552 and the n-doped layer 554 correspond to, and/or are formed by the corresponding processes described with respect to, the substrate 310, the buffer layer 320, the channel layer 330, the active layer 340, the p-doped layer 372 and the n-doped layer 374. However, in at least one embodiment, a passivation layer similar to the passivation layer 350 is not formed between the active layer 540 and the p-doped layer 552.

Figure 5B:
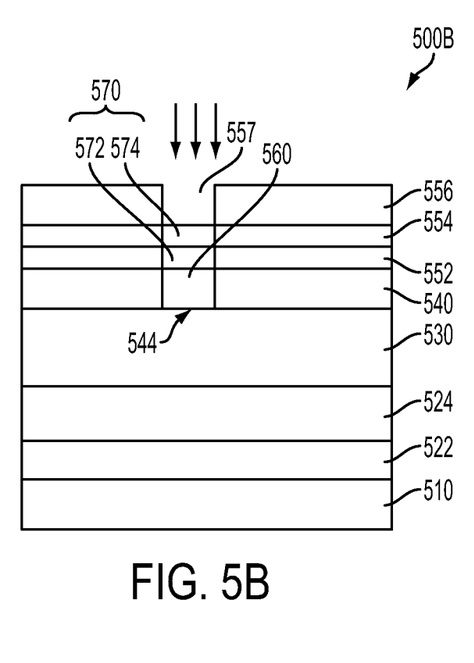

At operation 415 in FIG. 4, a negatively charged region is formed in a gate area of the active layer. For example, as shown in FIG. 5B, a negatively charged region 560 is formed in a gate area 544 of the active layer active layer 540, resulting in a structure 500B. In some embodiments, the negatively charged region 560 corresponds to the negatively charged region 160 or 360 described herein.

As shown in FIG. 5B, a photoresist layer 556 is formed over the n-doped layer 554, and patterned, e.g., by a lithography process, to define an opening 557 over the gate area 544 of the active layer 540. In some embodiments, the negatively charged region 560 is formed by an ion implantation process for implanting negative ions, through the n-doped layer 554 and the p-doped layer 552, into the gate area 544 of the active layer 540 to form the negatively charged region 560 therein. By performing the ion implantation through the n-doped layer 554 and the p-doped layer 552, it is possible, in some embodiments, to control the implantation depth and/or doping profile. Additionally or alternatively, it is possible, in some embodiments, to increase a charge concentration in the n-doped layer 554 and/or the p-doped layer 552. In at least one embodiment, an epitaxial (EPI) growth of the n-doped layer 554 and/or the p-doped layer 552 is performed together with the ion implantation. Examples of ion implantation processes include, but are not limited to, ionized metal plasma (IMP), plasma-enhanced chemical vapor deposition (PECVD), and reactive ion etch (RIE). Examples of negative ions include, but are not limited to, ions of one or more of F, Mg, Fe, C and Zn. In at least one embodiment, a concentration of the negative ions in the gate area 544 of the active layer 540 is from $1E18$ $cm^{-3}$ to $1E23$ $cm^{-3}$. In one example embodiment, the negatively charged region 560 is formed by IMP with F ions at plasma power of 50 to 50 KeV and at a dose of $1E15$ $cm^{-2}$. In at least one embodiment, the ion implantation introduces the negative ions into portions 572 and 574 of the p-doped layer 552 and the n-doped layer 554, respectively, over the gate area 544. The portions 572 and 574 define a gate structure 570 corresponding to the gate structure 170 or 370 described herein.

At operation 425 in FIG. 4, the p-doped layer and n-doped layer outside the gate area is removed to obtain a gate structure. For example, as shown in FIG. 5C, the p-doped layer 552 and the n-doped layer 554 outside the gate area 544 is removed to obtain a gate structure 570, resulting in a structure 500C.

Figure 5C:
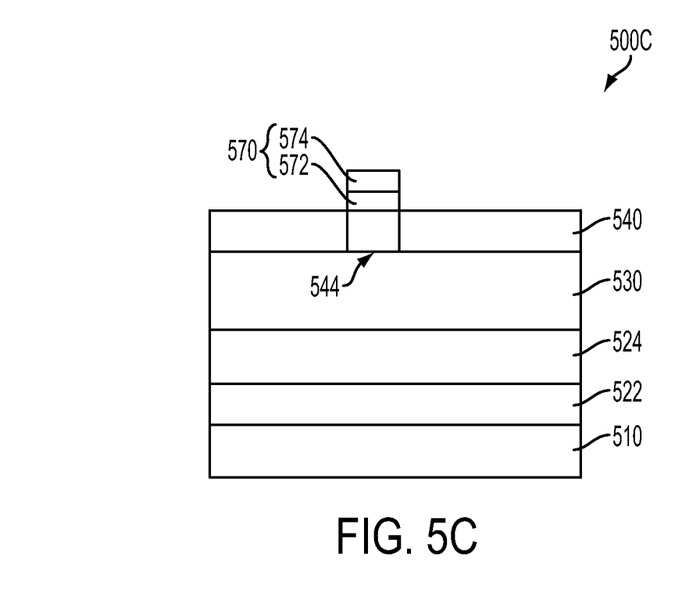

As shown in FIG. 5C, the photoresist layer 556 is removed after the ion implantation described with respect to FIG. 5B. For example, the photoresist layer 556 is removed by an ashing process. In at least one embodiment, a post-implantation anneal is performed to drive the implanted negative ions further into the active layer 540 and closer to the interface with the channel layer 530. For example, the post-implantation anneal is performed at a temperature of 1000 to 1100° C. for 60 seconds. The removal of the photoresist layer 556 exposes the underlying n-doped layer 554. The n-doped layer 554 and the underlying p-doped layer 552 in regions outside the gate area 544 are removed, e.g., by etching, leaving the gate structure 570 in the resulting structure 500C.

Figure 5D:
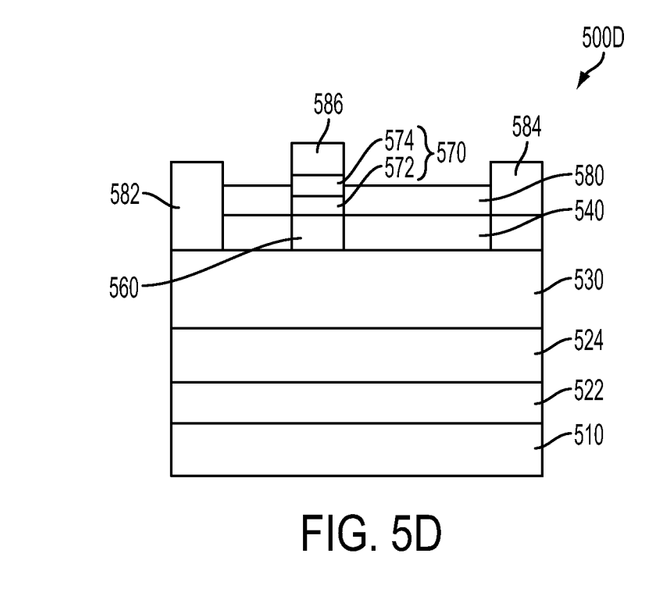

At operation 435 in FIG. 4, a source electrode, a drain electrode and a gate electrode are formed. For example, as shown in FIG. 5D, a source electrode 582, a drain electrode 584 and a gate electrode 586 are formed, resulting in semiconductor device 500D. In some embodiments, the source electrode 582, the drain electrode 584 and the gate electrode 586 correspond to, and/or are formed by the corresponding processes described with respect to, the source electrode 382, the drain electrode 384 and the gate electrode 386 described with respect to FIG. 3E. However, in at least one embodiment, before the source electrode 582, the drain electrode 584 and the gate electrode 586 are formed, a passivation layer 580 similar to the passivation layer 350 is deposited over the structure 500C. As a result of the formation of the source electrode 582, the drain electrode 584 and the gate electrode 586, a portion of the passivation layer 580 remains and surrounds the gate structure 570.

The above methods include example operations, but they are not necessarily required to be performed in the order shown. Operations may be added, replaced, changed order, and/or eliminated as appropriate, in accordance with the spirit and scope of embodiments of the disclosure. Embodiments that combine different features and/or different embodiments are within the scope of the disclosure and will be apparent to those of ordinary skill in the art after reviewing this disclosure.

According to some embodiments, a semiconductor device comprises a substrate, a channel layer formed over the substrate, an active layer formed over the channel layer, and a gate structure formed over the active layer. The active layer is configured to cause a two dimensional electron gas (2DEG) to be formed in the channel layer along an interface between the channel layer and the active layer. The gate structure is configured to deplete the 2DEG under the gate structure. The active layer has a negatively charged region under the gate structure. The negatively charged region is configured to further deplete the 2DEG under the gate structure.

According to some embodiments, a High Electron Mobility Transistor (HEMT) comprises a semiconductor substrate, a buffer layer formed over the semiconductor substrate, a channel layer formed over the buffer layer, an active layer formed over the channel layer, a gate structure formed over the active layer, and a source electrode and a drain electrode formed over the channel layer. The channel layer comprises GaN. The active layer comprises AlGaN. The gate structure comprises a p-doped layer formed over the active layer, an n-doped layer formed over the p-doped layer, and a gate electrode formed over the n-doped layer. The active layer has a negatively charged region under the gate structure. The negatively charged region includes negative ions.

In a method of manufacturing a semiconductor device in accordance with some embodiments, a channel layer is formed over a substrate. An active layer is formed over the channel layer. The active layer is configured to cause a two dimensional electron gas (2DEG) to be formed in the channel layer along an interface between the channel layer and the active layer. A negatively charged region is formed in a gate area of the active layer. The negatively charged region is configured to deplete the 2DEG under the gate area. A gate structure is formed over the gate area of the active layer. The gate structure is configured to further deplete the 2DEG under the gate area.

It will be readily seen by one of ordinary skill in the art that one or more of the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A semiconductor device, comprising:
 a substrate;
 a channel layer formed over the substrate;
 an active layer formed over the channel layer, the active layer configured to cause a two dimensional electron gas (2DEG) to be formed in the channel layer along an interface between the channel layer and the active layer; and
 a gate structure formed over the active layer, the gate structure configured to deplete the 2DEG under the gate structure;
 wherein the active layer has a negatively charged region under the gate structure, the negatively charged region configured to further deplete the 2DEG under the gate structure.

2. The semiconductor device of claim 1, wherein the negatively charged region includes negative ions.

3. The semiconductor device of claim 2, wherein the negative ions included in the negatively charged region are also included in the gate structure.

4. The semiconductor device of claim 1, wherein the gate structure comprises a p-doped layer formed over the active layer.

5. The semiconductor device of claim 4, wherein the gate structure further comprises an n-doped layer formed over the p-doped layer.

6. A High Electron Mobility Transistor (HEMT), comprising:
 a semiconductor substrate;
 a buffer layer formed over the semiconductor substrate;
 a channel layer formed over the buffer layer, the channel layer comprising GaN;
 an active layer formed over the channel layer, the active layer comprising AlGaN;
 a gate structure formed over the active layer, the gate structure comprising:
  a p-doped layer formed over the active layer,
  an n-doped layer formed over the p-doped layer, and
  a gate electrode formed over the n-doped layer; and
 a source electrode and a drain electrode formed over the channel layer;
 wherein the active layer has a negatively charged region under the gate structure, the negatively charged region including negative ions.

7. The HEMT of claim 6, wherein the negative ions are ions of at least one element selected from the group consisting of F, Mg, Fe, C and Zn.

8. The HEMT of claim 7, wherein a concentration of the negative ions in a region of the active layer under the gate structure is from $1E18$ $cm^{-3}$ to $1E23$ $cm^{-3}$.

9. The HEMT of claim 6, wherein the negative ions are also included in at least one of the n-doped layer or the p-doped layer.

10. The HEMT of claim 6, wherein the n-doped layer includes n-doped GaN and the p-doped layer includes p-doped GaN.

11. The HEMT of claim 10, wherein
 the buffer layer comprises:
  a first AlN layer formed over the semiconductor substrate; and
  a plurality of first AlGaN layers formed over the first AlN layer and under the channel layer, the plurality of first AlGaN layers having an Al concentration reducing toward the channel layer, and
 the active layer comprises:
  a second AlN layer formed over the channel layer; and
  a second AlGaN layer formed over the second AlN layer.

12. The HEMT of claim 11, further comprising:
 a passivation layer formed over the active layer, the passivation layer surrounding the gate structure.

13. A method of manufacturing a semiconductor device, the method comprising:
 forming a channel layer over a substrate;
 forming an active layer over the channel layer, the active layer configured to cause a two dimensional electron gas (2DEG) to be formed in the channel layer along an interface between the channel layer and the active layer;
 forming a negatively charged region in a gate area of the active layer, the negatively charged region configured to deplete the 2DEG under the gate area; and
 forming a gate structure over the gate area of the active layer, the gate structure configured to further deplete the 2DEG under the gate area.

14. The method of claim 13, wherein the forming the negatively charged region comprises implanting negative ions into the gate area of the active layer.

15. The method of claim 14, wherein said implanting comprises implanting negative ions of at least one element selected from the group consisting of F, Mg, Fe, C and Zn, to achieve a concentration of the negative ions in the gate area from $1E18$ $cm^{-3}$ to $1E23$ $cm^{-3}$.

16. The method of claim 14, wherein said implanting comprises at least one selected from the group consisting of an ionized metal plasma (IMP) process, a plasma-enhanced chemical vapor deposition (PECVD) process and a reactive ion etch (RIE) process.

17. The method of claim 13, further comprising:
 forming a passivation layer over the active layer; and
 implanting negative ions, through the passivation layer, into the gate area of the active layer underlying the passivation layer to form the negatively charged region in the gate area.

18. The method of claim 17, further comprising, after said implanting:
 removing an area of the passivation layer over the gate area to expose the negatively charged region;
 forming a p-doped layer over the exposed negatively charged region; and
 forming an n-doped layer over the p-doped layer, wherein the p-doped layer and the n-doped layer define the gate structure.

19. The method of claim 13, further comprising:
 forming a p-doped layer over the active layer,
 forming an n-doped layer over the p-doped layer,
 implanting negative ions, through the n-doped layer and the p-doped layer, into the gate area of the active layer underlying the p-doped layer and n-doped layer to form the negatively charged region in the gate area.

20. The method of claim 19, further comprising:
 removing the p-doped layer and n-doped layer outside the gate area, wherein the p-doped layer and the n-doped layer remaining over the gate area define the gate structure; and
 forming a passivation layer around the gate structure.

* * * * *